United States Patent [19]
Russell

[11] 3,948,736
[45] Apr. 6, 1976

[54] METHOD OF SELECTIVE ELECTROPLATING AND PRODUCTS PRODUCED THEREBY

[75] Inventor: Robert A. Russell, Rosemont, Pa.
[73] Assignee: Ametek, Inc., New York, N.Y.
[22] Filed: July 22, 1974
[21] Appl. No.: 490,737

[52] U.S. Cl. .................................................. 204/15
[51] Int. Cl.² ........................................ C25D 5/02
[58] Field of Search ............................. 204/15–18

[56] References Cited
UNITED STATES PATENTS

| | | | |
|---|---|---|---|
| 1,750,418 | 3/1930 | McFarland | 204/18 R |
| 1,996,187 | 4/1935 | Barnhart | 204/18 R |
| 2,028,013 | 1/1936 | Reilly | 204/18 R |
| 2,367,314 | 1/1945 | Russell | 204/15 |
| 3,322,655 | 5/1967 | Garibotti et al. | 204/15 |
| 3,809,625 | 5/1974 | Brown et al. | 204/15 |

Primary Examiner—T. M. Tufariello
Attorney, Agent, or Firm—Whann & McManigal

[57] ABSTRACT

A novel method for the selective electrodeposition of a metallic coating onto a base material and the products produced thereby. In the method of the invention, a thin adherent coating of an electrically conductive material is initially applied to the base material to mask off those portions of the material not to be electroplated. The composite thus formed is then placed in a suitable electroplating apparatus wherein a metallic coating such as gold or other precious metal is electrodeposited onto the portions of the composite not covered by the masking material. After electroplating the masking material may readily be removed from the base material by chemical or mechanical means, or it may be left intact on the plated article to perform a utilitarian or decorative function in the end product application.

12 Claims, 7 Drawing Figures

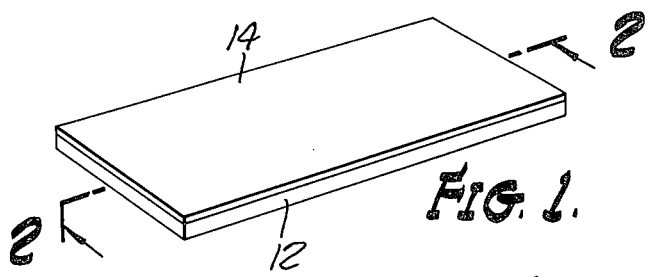
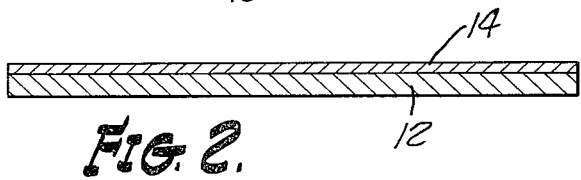
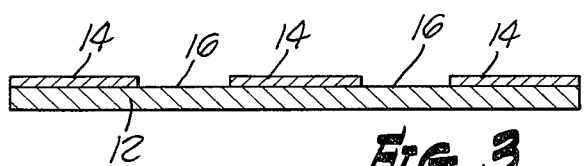
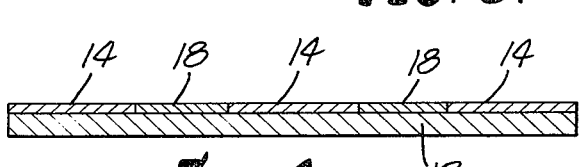
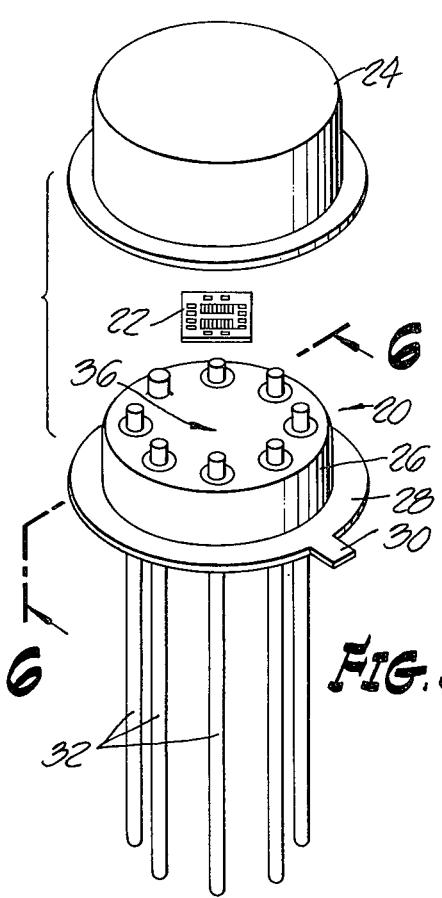
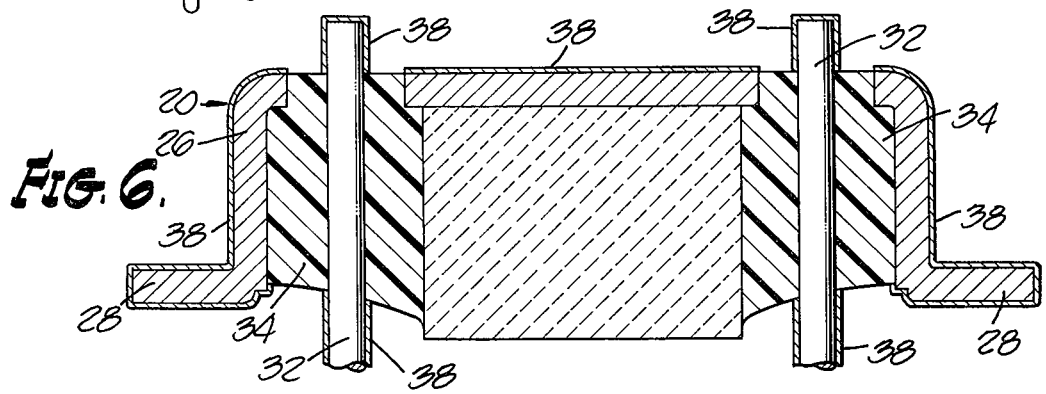
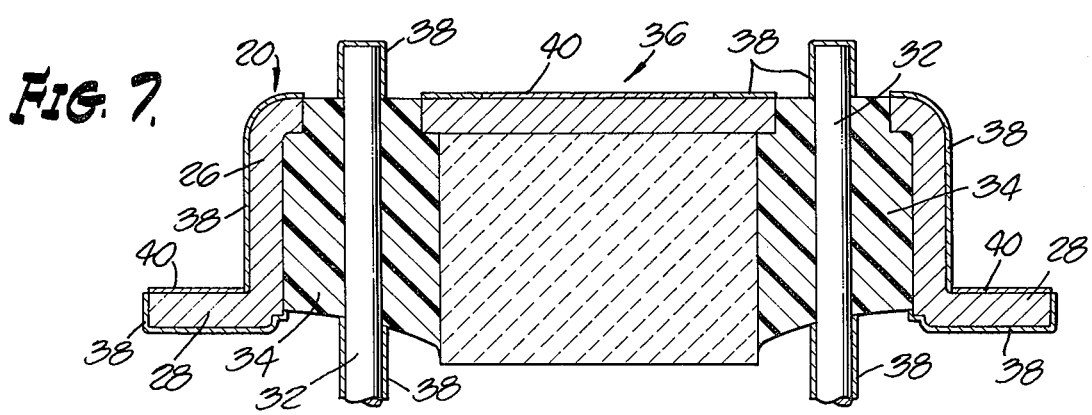

METHOD OF SELECTIVE ELECTROPLATING AND PRODUCTS PRODUCED THEREBY

BACKGROUND OF THE INVENTION

1. Field of the Invention

The present invention relates generally to selective electroplating techniques and products produced thereby, and more particularly to novel methods for the selective electroplating of precious metals such as gold onto various types of base materials.

2. Discussion of the Prior Art

Electroplating, that is the electrodeposition of an adherent metallic coating onto a base material, is a well known and highly useful technique. Coatings produced by electrodeposition methods may perform a utilitarian function, such as preventing corrosion of the base metal, e.g., plating with zinc (electrogalvanizing) or with tin, or they may perform a decorative function, e.g., plating with gold or silver to produce fine jewelry and the like, or they may perform both functions, e.g., brass plating of hardware parts. Another important utilitarian application of electroplating, and one particularly pertinent to the present invention, relates to the electrodeposition of metallic coatings onto electronic components interfaces to facilitate the bonding together of the components by such techniques as ultrasonic and thermo-compression bonding as well as by more conventional bonding techniques, such as soldering, brazing, and the like. For example, in the production of electronic parts such as semiconductor devices, gold plating is widely used on the mating interfaces of the various component parts of the devices to provide low electrical contact resistance and to insure proper bonding during final assembly of the semi-conductor package. Although a wide variety of precious metal coatings are used in the electronics field to facilitate bonding and enhance reliability, gold plating is perhaps the most common. Particularly in the production of semiconductor devices, gold provides many highly desirable properties. It is corrosion resistant, has good electrical conductivity, readily accepts solder, can be eutectically bonded to silicon chips, can be ultrasonically bonded, can be thermo-compression bonded, and does not oxidize at elevated temperatures.

Because of the numerous advantages provided by precious metal coatings, very significant quantities of metals such as gold, silver, rhodium, palladium and platinum are presently being used by both domestic and foreign industries. However, because of the extremely high cost of these metals, there has been a continued on-going effort to find ways to reduce or avoid their use. Avenues of investigation have included extensive evaluation of materials such as aluminum and various non-precious metal alloys as substitutes for the gold or other precious metals. Also, considerable effort has been directed toward the development of methods and techniques for precision selective electroplating of various types of precious metals.

Efforts directed toward the substitution of less expensive metals and metal alloys for the precious metals has found limited application. Frequently, it has been found that savings achieved by reductions in the amount of the precious metal used are offset by the loss of performance and reliability of the end product or by reduced production rates and production yields directly attributable to the use of the substitute materials.

Techniques developed for the selective electroplating of the precious metals have shown somewhat more promise. However, a great many of the prior art techniques which have been suggested for selective electroplating, although successful in reducing the quantities of precious metal used, require costly specialized equipment and result in reduced production rates.

Before undertaking a discussion of the numerous advantages of the method of selective electroplating of the present invention over prior art techniques, a brief review of prior art methods is perhaps in order. In the main, the prior art techniques for selective electroplating are of two general types. Those in which the areas of the part which are not to be plated are isolated or masked off by mechanical means such as by clamping or otherwise affixing reusable templates or the like to the articles to be plated; and those which involve the use of some type of discardable plastic or non-conductive masking material which is sprayed on, bonded or otherwise affixed to the area of the part which are not to be plated.

The significant drawback of the first mentioned class of prior art methods is the mechanical complexity and concomitant high cost of the fixturing required to support large volume production. The significant drawback of the second class of methods is the difficulty and resulting high cost of first applying and later removing masking material from the part. Such difficulties are particularly pronounced when the components to be selectively plated are very small and of complex, irregular configuration such as semiconductor devices, miniaturized printed circuit boards, and the like.

A major drawback of both classes of the aforementioned prior art techniques is that the masked off components often cannot be electroplated by conventional low-cost barrel plating methods. It is a fundamental requirement of all barrel plating processes that the components to be plated be electrically conductive, i.e., be able to conduct electrical current from part to part within the mass of parts being plated within the barrel. The use of masking templates or coatings formed of a plastic base material such as those used in the prior art selective electroplating techniques make barrel plating impractical.

Because of these and other drawbackss of prior art selective electroplating methods, many industrial concerns, particularly those involved in the manufacture of electronic components, are often forced to apply the precious metal coating over the entire component rather than trying to confine the coating only to critical areas.

When it is realized that in the production of many types of electrical components by present techniques the area of the parts which are actually being plated with precious metal substantially exceeds that which is required to be plated for functional and performance reasons, the significant commercial value of the present invention becomes readily apparent.

SUMMARY OF THE INVENTION

It is an object of the present invention to provide a novel and inexpensive method for electrodepositing precious metals onto a base material only in the precisely defined areas where the precious metal coating is required thereby in any particular application minimizing the amount of precious metal which must be used.

It is another object of the present invention to provide a novel method for selectively electroplating various articles in which the areas of the article which are not to be electroplated are covered by a thin film of electrically conductive masking material, which material will not accept electrodeposition thereon of precious metals such as gold under normal processing conditions, will adhere tightly to the article and will not chip or flake off, and yet, if desired, can readily be removed by mechanical or chemical means.

It is another object of the invention to provide a method of the aforementioned character in which the masking material applied to the article to be electroplated will in no way interfere with electroplating the article by conventional barrel plating techniques.

It is another object of the invention to provide a method as described in the preceding paragraphs in which the masking material which is affixed to the article to be electroplated is capable of serving both a utilitarian and decorative function thereby tending to enhance the final product.

It is another object of the invention to provide a novel method of the type described which is particularly suitable for selective electroplating of small objects of complex irregular shape such as electronic components, and in which the masking material which is affixed to the article to be plated will not in any way adversely affect the performance of the electronic component.

It is a further object of the invention to provide a method as described in the preceding paragraph in which, if desired, the masking material can be readily removed from all or portions of the plated component by chemical means or by mechanical means such as sandblasting.

It is still another object of the invention to provide a method of the class described in which the masking material is an electrically conductive metal such as aluminum which is capable of being electrodeposited onto the article.

It is another object of the invention to provide a method of the class described in which the masking material is an electrically conductive material such as aluminum which may be deposited onto the article to be plated by vapor deposition techniques, flame spraying, vacuum deposition processes, or similar techniques well known in the art.

It is another object of the invention to provide a method as previously described in which, after selective removal of the masking material, the part is electroplated with a non-precious metal such as copper.

It is a further object of the invention to provide a part ready for electroplating of selective areas thereof in which all surfaces of the part other than those to be electroplated are covered with an electrically conductive masking coat such as aluminum.

It is another object of the invention to provide a semiconductor device in which the die attach area, the extremities of the bonding posts, and the closure cap joining area are plated with gold and the remaining surfaces of the device are plated with aluminum.

It is still another object of the invention to provide a novel method for the production of unique, high quality products of the class described which is compatible with existing commercial practices, can be accomplished with minimum expenditures for special tooling, is adaptable to high volume production, and can be performed automatically with minimum direct labor costs.

In summary, these and other objects of the present invention can be realized by a novel method for selectively electroplating a base material comprising the steps of forming on the base material, an electrically conductive first coating such as aluminum, which first coating is located so as to expose selected portions of the base material and electrodepositing onto the exposed portions of the base material a second coating comprising a material such as gold which will not deposit on the first coating.

BRIEF DESCRIPTION OF THE DRAWINGS

FIG. 1 is a perspective view of a laboratory test specimen to which a first coating of an electrically conductive material has been applied in accordance with the method of the present invention.

FIG. 2 is a cross-sectional view of the composite of FIG. 1 taken along lines 2—2 of FIG. 1.

FIG. 3 is a cross-sectional view similar to that shown in FIG. 2, but illustrating the appearance of the composite after portions of the first coating have been removed from selected areas of the specimen.

FIG. 4 is a cross-sectional view showing the appearance of the composite of FIG. 3 after electro-deposition of a second coating of a metallic material onto the areas of the specimen from which the first coating had been removed.

FIG. 5 is an exploded view of a semiconductor device, portions of which have been coated with an electrically conductive material in accordance with the method of the present invention, illustrating the various parts of the semiconductor device and their arrangement within the semiconductor package.

FIG. 6 is an enlarged cross-sectional view of one part of the semiconductor device taken along lines 6—6 of FIG. 5.

FIG. 7 is a cross-sectional view similar to FIG. 6 but showing the appearance of the part after electrodeposition of an adherent metallic coating onto selected portions thereof in accordance with the method of the invention.

DESCRIPTION OF THE PREFERRED EMBODIMENTS

The method of the invention in its simplest form can perhaps best be understood by referring to FIGS. 1–4 of the drawings and Examples 1–5 of the description which follows. These figures and the examples related thereto illustrate and describe the processing of laboratory test specimens in accordance with the basic method of the invention to accomplish precision electrodeposition of a tightly adherent metallic coating onto selected portions of the specimens.

Referring to FIG. 1, the test specimen 12 is shown in the form of a strip of metal or metal alloy, although for certain applications it may be non-metallic. As a first step in the process, the specimen is thoroughly cleaned and degreased, after which an electrically conductive first coating 14 is applied to the specimen. First coating 14 may consist of various types of materials which may be applied to the base material to form an adherent coating by means of electrodeposition, vapor deposition, flame spraying or like techniques.

The next step in the method of the invention in its simplest form is the removal of first coating 14 from the base material in those areas which are to be electroplated. FIG. 3 illustrates the appearance of the test specimen after removal of the coating 14 in the areas generally designated by the numeral 16. First coating 14 may be removed by mechanical or chemical means, depending upon the nature of the material of the first coating and of the base material. For example, when aluminum is used as the material for the first coating, removal may be readily accomplished by mechanical abrasion techniques including, but not limited to, grinding, buffing, sand blasting, dry or wet abrasive honing and scraping. Similarly, first coating 14 may be removed in selected areas by means of chemical etching using, for example, a solution of dilute hydrochloric acid or a solution of sodium hydroxide.

After the removal of first coating 14 from the areas 16, the composite thus formed is placed into an electroplating means for electrodeposition of an adherent metal coating onto the base material in those areas wherein first coating 14 has been removed. Referring to FIG. 4, this adherent metallic coating is generally designated by the numeral 18.

Following the electrodeposition step, first coating 14 may be partially or completely removed from the base metal by chemical or mechanical means of the type previously described. In the practice of the method of the invention, the base material or article to be plated must be of a type which is or which can be made susceptible to the application of the first coating material and to the electrodeposition of the second coating material, or electroplate. In the examples which follow, the specimens comprise copper or steel strips. As will become apparent from the discussion which follows, a wide variety of other materials may comprise the base material or article to be electroplated. In those instances where the base material is not susceptible to application of the first coating or the electroplate, the application of an intermediate coating of a suitable material may be necessary. The material selected for the intermediate coating may be nickel, tin, zinc, silver or a wide variety of other materials which may be electrodeposited, vapor deposited, flame sprayed, vacuum deposited or otherwise applied to the base material.

The material of the first coating must meet two basic requirements. It must be susceptible of application to the base material to form a tightly adherent coating and, secondly, it must be a material which will not accept electro-deposition thereon of the second coating or electroplate material under conditions of normal processing for the second coating. For reasons presently to be discussed, it is also highly desirable that the material of the first coating be electrically conductive.

As indicated in the examples which follow, when the second material to be electrodeposited on the base material is a precious metal such as gold, aluminum has been found quite satisfactory for use as the first coating material. As illustrated by the examples which follow, aluminum has the desirable characteristics of being susceptible to deposition on many base materials by electrodeposition, vapor deposition, vacuum deposition, or flame spraying and, secondly, has the important characteristic of not accepting electrodeposition of metals such as gold.

The second coating or electroplate material must have the following characteristics. It must be susceptible to electrodeposition onto the base material or onto an intermediate coating applied to the base material, it must be suitable for desired end product use, and under normal electrodeposition conditions it must resist electrodeposition onto the material of the first coating. The second coating or electroplate may consist of a wide variety of materials including precious metals such as gold, platinum, palladium and rhodium, or non-precious metals such as copper.

Although each of the combinations of base material, first coating and second coating will not be set forth herein, the selection of proper combinations is well within the abilities of those skilled in metallurgy, electro-chemistry and related sciences.

Because of the wide application of the method of the present invention to the electronic industry, examples 6–13 which follow have been included to illustrate one very important application of the method of the invention, namely its use in the selective electroplating of semiconductor devices. These examples are intended to supplement the earlier discussion and to forcefully illustrate, by way of practical example, the significant commercial value of the invention. It is to be understood, however, that the method of the invention is by no means limited to the applications described in the examples. On the contrary, the method as disclosed herein has direct application in any field in which selective electroplating is advantageous, including the manufacture of circuit boards, computer memory discs and accessories, fine jewelry, and the like. The examples, and the discussion which follows, do forcefully illustrate, however, that in spite of the great commercial value of the present invention and its relative simplicity, the process has, to date, eluded those skilled in the plating and electronic arts.

To enable a better understanding of the examples set forth hereinafter, a brief discussion of semiconductor devices is believed appropriate.

Semiconductor devices such as, for example, transistors and diodes, in which the essential electronic conducting takes place in a semiconductor, are usually assembled and sealed within special packages to prevent their being damaged or affected by mechanical shock or corrosive environments. A variety of package configuration are typically used, depending upon the specific nature of the semiconductor device and the requirements of the electronic equipment in which the semiconductor device is to be used.

Irrespective of the particular type of package used, it must provide one or more of the following functions:

1. mechanical support for the semiconductor chip or die;
2. means for the electrical interconnection of the semiconductor chip to external circuitry;
3. means for the protection of the semiconductor chip from mechanical damage; and
4. means for the isolation of the semiconductor chip from the ambient environment by means of hermetic sealing.

In addition to these requirements, the material of which the package is comprised should not in any way interfere with the performance or functionality of the semiconductor device.

For purposes of illustration of the method of the invention and of one of the products produced thereby, the packaging configuration shown in the drawings will be considered. It will, of course, be obvious to those skilled in the art that the method of the invention is equally applicable to semiconductor packages of different types and configurations.

Referring now to the drawings, and particularly to FIG. 5, the basic components of the semiconductor device illustrated comprise a supporting member, or header 20, a semiconductor chip 22, and a closure member, or hat-shaped metal cap 24. Supporting member 20 comprises a generally cylindrically shaped body portion 26 having an annular shaped flange 28 integral therewith. A projection 30 is provided on flange 28 for the purpose of indexing the supporting member during assembly operations. A plurality of leads 32 protrude through the upper surface of body 26. Optionally, one lead is connected to the body portion so as to make electrical contact with it. The remaining leads are generally electrically insulated from the supporting member. As best seen by referring to FIG. 6, leads 32 are held firmly in place within the supporting member by means of a glass or ceramic-like material 34 which is used to support and electrically insulate the leads from the supporting member. The glass or ceramic-like material 34 also serves the purpose of forming an hermetic seal to prevent the passage of gas or other materials into the assembled semiconductor device.

A material commonly used to manufacture the supporting member 20, as well as leads 32, is Kovar. The closure member 24 may be constructed from a variety of metals including carbon steel and Kovar. During the assembly of the semiconductor device, the semiconductor chip is bonded to the upper surface of body 26 in a die attach area generally designated in FIG. 5 by the numeral 36. The bonding may be accomplished in several ways, including using solder preforms or eutectic alloy formation. To facilitate bonding, the die attach area is coated by a precious metal such as gold. After the semiconductor chip has been affixed to the base member 20, the terminals thereof are connected to the top of the appropriate lead 32 by means of fine wires, typically made from gold or aluminum. To facilitate bonding, the upper extremities of the leads are also coated with a precious metal such as gold. Finally, the closure member 24 is placed over the body portion 26 of supporting member 20 and bonded to flange 28 so as to achieve an hermetic seal. Bonding may be accomplished by such techniques as soldering, brazing, or resistance welding. To facilitate the bonding operation, flange 28 is also generally coated with a precious metal, such as gold.

As previously pointed out, because of the drawbacks of prior art selective electroplating methods, the entire supporting member, as well as the leads attached thereto, are commonly electroplated with gold, using standard barrel plating techniques. Typically, the gold plating has a thickness of on the order of 50 micro inches and covers the entire surface of support member 26, as well as the surfaces of leads 32. It is obvious from the description of the assembly operations of the semiconductor device, as set forth in the preceding paragraphs, that the only areas upon which the gold plating is required is the die attach area 36, the upper surface of flange 28, and the upper extremities of the leads 32. These surfaces represent only a small percentage of the total surface area of the supporting member and leads 32, which surfaces are currently being completely plated with the precious metal coating. It will be apparent from the paragraphs which follow that the application of the method of the present invention to the selective electroplating of semiconductor devices of the type illustrated will result in significant reductions in the amount of precious metal which must be used in the electroplating operations.

As a first step in the practice of the method of the present invention to the selective electroplating of semiconductor devices, an electrically conductive first coating is formed on the support member 26. This coating, which is identified by the numeral 38 in FIG. 6, is applied to the entire outer surface of supporting member 20, as well as to the outer surfaces of leads 32. For this particular application, aluminum has been found to be quite satisfactory as a material for first coating 38. The aluminum is preferably applied to the support member and the leads 32 by electrodeposition techniques, although it may also be applied by vapor deposition or other methods previously described. When the first coating is applied by electrodeposition techniques, the electroplating may be accomplished in a conventional barrel plating apparatus and large numbers of components may be simultaneously processed.

After application of first coating 38, portions of the coating in the die attach area 36, on the upper surface of flange 28, and on the upper extremities of leads 32 are removed by mechanical abrasion or chemical etching in the manner previously discussed. This step forms cavities or voids in the first coating 38 at the die attach area, the tops of leads 32 and coextensive with the upper surface of flange 28 which comprises the joining surface of support member, or header 20. Following removal of first coating 38 in the selected areas, a second coating, or electroplate 40 (FIG. 7), is formed on the supporting member at the die attach area 36 and on the upper surface of flange 28. In practice, gold has proven quite satisfactory as the material to be used for the second coating. Additionally, because of the fact that the first coating of aluminum is both electrically conductive and resists electrodeposition thereon of gold, the electroplating step may be carried out in a conventional barrel plating apparatus. When such a technique is used, leads 32 are interconnected together to facilitate conduction of electricity among the parts to be plated. Because of the fact that gold will not electrodeposit onto aluminum, only those areas of the part from which the aluminum coating has been removed will be electroplated with the gold. In this way, the gold plating is deposited onto the headers only in the necessary areas, thereby significantly reducing the amount of gold which must be used in the electroplating step.

Following the electrodeposition of the gold plating, the aluminum, or first coating 38, may be removed from the header and portions of leads 32 or, since the coating itself is electrically conductive, corrosion resistant, and will not chip or peel off of the component, it may be left intact. When it is desired to remove all or part of the coating 38, removal may be readily accomplished by mechanical abrasion means, such as sand blasting or wet or dry abrasive honing, or by chemical etching using a solution of dilute hydrochloric acid, a solution of sodium hydroxide, or by other means which will not detrimentally affect the base material or the electroplating.

The details of the methods of the invention are illustrated in the examples which follow. These examples along with the preceding discussion will enable those skilled in the art to readily practice the invention.

EXAMPLE NO. 1

A copper metal test specimen was completely coated with aluminum by a room temperature electrodeposition process of a type known in the art consisting of an improved version of the Schmidt and Hess process as described in an article entitled "Electroplating With Aluminum — A Commercial Reality", published in the March, 1971 issue of Metal Finishing Guidebook and Directory, published by Metals & Plastics Publications, Inc. of Westwood, N.J. Those skilled in the electroplating art, having the article before them and the information referenced therein, would have no difficulty in suitably plating the specimen with aluminum. Following the electroplating step, the aluminum coating was then carefully removed from selected sections of the test specimen by means of an abrading tool. Next, a resistance test was performed using a multi-ohm-meter to ascertain that both the coated and uncoated portions of the strip were electrically conductive. The specimen was then placed in a commercially available gold electroplating solution sold under the trade name "Autronex C I" manufactured by the Sel-Rex Corporation. Gold plating of the specimen was accomplished in general accordance with processing parameters setforth on pages 289–294 of the section entitled "Goldplating" appearing in the 1973 Metal Finishing Guidebook and Directory, published by Metals & Plastics Publications, Inc. of Westwood, N.J.

Following the gold plating step, microscopic examination of the specimen revealed that a bright gold coating was uniformly deposited on the sections of the specimen from which the aluminum had been removed. The gold was tightly bonded to these sections of the specimen, but there was no evidence of any gold plating on the sections of the specimen which were coated with aluminum during the gold deposition step.

EXAMPLE NO. 2

A copper metal test specimen was coated with aluminum using a vacuum deposition technique well known in the art, as set forth on pages 1103–1110 of a work entitled "The Surface Treatment and Finishing of Aluminum and Its Alloys" by S. Wernick and R. Pinner, Fourth Ed., Vol. 2, published in 1972 by Robert Draper Ltd., Teddington, Great Britain. Following the vapor deposition step, the aluminum coating was then carefully removed from selected sections of the test specimen by means of an appropriate abrading tool. Both the coated and uncoated portions of the specimens were determined to be electrically conductive and the specimen was placed in the Sel-Rex Corporation bath for gold plating in accordance with the method of Example No. 1. Microscopic examination of the specimen showed that a bright gold coating had been uniformly and adherently deposited on those areas of the specimen from which the aluminum coating had been removed. There was no evidence of gold plating upon those surfaces of the specimen upon which the aluminum coating remained.

EXAMPLE NO. 3

A strip of aluminum foil was mechanically attached to a copper metal specimen so that the foil was in intimate uniform engagement with a portion of the surface of the specimen. Using a multi-ohm-meter, it was determined that both the coated and uncoated portions of the specimen were electrically conductive. The specimen with the aluminum foil in place was inserted into the gold electroplating bath manufactured by Sel-Rex Corporation and the specimen was gold plated in accordance with the method of Example No. 1. Following the gold-plating step, microscopic examination of the specimen revealed that a bright gold coating was uniformly deposited on the portions of the specimen not covered by the aluminum foil. No evidence of any gold plating on the aluminum foil was observed.

EXAMPLE NO. 4

A test specimen made from steel was coated with aluminum by means of a flame spraying process well known in the art, as described on pages 1060–1085 of the previously referred to book entitled "The Surface Treatment & Finishing of Aluminum and Its Alloys", Volume 2. The aluminum was then selectively removed from one section of the steel specimen. Both the coated and uncoated portions of the specimen were determined to be electrically conductive. The specimen was then gold plated in accordance with the method of Example No. 1. As in the case of the copper specimens, microscopic examination of the steel specimen also revealed a bright gold coating uniformly and adherently deposited on the areas of the specimen from which the aluminum coating had been removed. There was no evidence of gold plating on any surface of the part upon which the aluminum coating remained intact.

EXAMPLE NO. 5

A steel specimen was coated with a film of aluminum by vapor deposition techniques well known in the art, as described on pages 1122–1124 of the previously identified book entitled "The Surface Treatment & Finishing of Aluminum and Its Alloys", Volume 2. Next, aluminum was removed from selected portions of the steel specimen and the specimen was gold plated in accordance with the procedure of Example No. 4. Inspection of the specimen revealed a bright uniform gold coating on the areas where the aluminum had been removed. In the areas coated by aluminum, however, no trace of gold plating was observed.

EXAMPLE NO. 6

The support member of base portion of the semiconductor device of FIG. 5 was completely coated with aluminum by electrodeposition in a non-aqueous electrolyte in general accordance with the Schmidt and Hess process previously referred to in Example No. 1. The aluminum was then removed from the die attach area and the upper surface of the flange by means of mechanical abrasion, using a small grinding tool. Following the abrading step, both the aluminum coated portions and the uncoated portions of the base were determined to be electrically conductive.

Next, the base was placed in the previously referred to commercially available gold electroplating bath manufactured by the Sel-Rex Corporation and electrodes were suitably attached. Current was applied at a current density of approximately 10 amps per square foot for 4 minutes to deposit a film of gold at a thickness of on the order of 30 microinches. During this plating operation, the base was rotated to simulate barrel plating conditions.

After the gold plating step, microscopic examination of the base revealed that a bright gold coating was uniformly deposited only on those areas of the base from which the aluminum had been removed. The gold film was tightly bonded to the part and there was no evidence of gold on any of the surfaces of the part coated with aluminum.

EXAMPLE NO. 7

The die attach area and the flange of the support member of the semiconductor device was coated with a commercially available polymeric material known at "Turco 5696", manufactured and sold by Turco Products, a Division of Purex Corp., Ltd. The material was applied in accordance with the manufacturer's instructions. The part was then electroplated in the manner of Example No. 6. After removal of the polymeric material, inspection of the coated part revealed that no aluminum had been deposited in the areas covered by the polymeric material which is an electrical insulator.

Next, the part was immersed in the Sel-Rex Corporation bath and electroplated in the manner set forth in Example No. 1. Microscopic examination of the part once more revealed a bright gold coating uniformly and adherently deposited on those areas of the base which were not previously coated with aluminum. There was no evidence of gold on any surface of the part upon which aluminum had been plated.

EXAMPLE NO. 8

A multiplicity of semiconductor support members of the type illustrated in the drawings were completely coated with aluminum in the manner described in Example No. 6. After plating, the aluminum was carefully removed by abrading from the die attach area and the flange of each part.

Following the selective removal of the aluminum plating, the group of parts was placed in a commercially available barrel plating apparatus of the type manufactured by National Plastics & Plating Supply Co., Inc. Gold plating of the parts was accomplished in a manner well known in the art, as described in the section entitled "Barrel Plating" by F. J. LaManna, published in the previously identified 1973 Metal Finishing Guidebook & Directory. Following the barrel plating of the components, each part was examined microscopically. In those areas where the aluminum coating had been removed, there appeared a bright, uniform and adherent coating of gold. In those areas coated with aluminum, absolutely no evidence of gold coating was observed.

EXAMPLE NO. 9

The support member of the semiconductor device of FIG. 5 was completely coated with nickel, using an electroplating solution of the "Watts Type". Plating was accomplished in a manner well known in the art and in general accordance with the processing parameters for nickel coating as set out on page 338 of the 1973 Metal Finishing Guidebook & Directory. Following this step, the part was completely coated with aluminum by the electrodeposition technique of Example No. 6. Next, the aluminum was removed from the die attach area and the upper surface of the flange by mechanical abrasion techniques. Finally, the part was gold plated in the manner set forth in Example No. 1. Inspection of the component revealed a bright uniform gold coating in the areas where the aluminum had been removed. In the areas coated by aluminum, however, no trace of gold plating was observed.

EXAMPLE NO. 10

The base portion of the device was first nickel plated and then aluminum plated in accordance with the process of Example No. 9. Next, the aluminum coating was removed from the die attach area and the upper surface of the flange by the application of a dilute hydrochloric acid solution to these areas. The part was then washed and placed in the Sel-Rex Corporation bath for gold plating. Microscopic examination of the part revealed that gold had been uniformly and adherently deposited in the areas of the part from which the aluminum coating had been removed. No gold plating was found on the areas of the component covered with aluminum.

EXAMPLE NO. 11

The support member of the semiconductor device shown in the drawings was first plated with aluminum in accordance with the process of Example No. 9. Next, the aluminum coating was removed from the die attach area and upper flange area by the application of a solution of sodium hydroxide to those areas. After washing, the part was gold plated in the Sel-Rex Corporation bath. Careful examination of the part showed that a bright uniform gold coating had been tightly deposited onto the part in the areas where the aluminum had been removed by the sodium hydroxide solution. The portions of the component where the aluminum coating remained were free of gold.

EXAMPLE NO. 12

The support member of the semiconductor device shown in the drawings was processed in accordance with Example No. 9. After gold plating, all of the aluminum previously plated on the part was removed by chemical etching using a sodium hydroxide solution. Examination of the part revealed that the condition of the Kovar base metal was unchanged from its original condition prior to aluminum electroplating.

EXAMPLE NO. 13

A Kovar test specimen was plated with aluminum in accordance with Example No. 9. Next, the aluminum was removed from selected portions thereof by chemical etching using the sodium hydroxide solution. After washing, the specimen was electroplated at a current density of 20 amps per sq. ft. in a solution consisting of 3.5 gms $Cu(CN)_2$; 6 gms 1(CN); and 250 mc $H_2O$ to which sufficient salicylic acid was added to reduce the PH to 10.5. Examination of the finished part revealed that a bright copper plate was deposited on the Kovar surface. There was no evidence of copper deposited on the aluminum covered surfaces.

Having now described the invention in detail in accordance with the requirements of the patent statutes, those skilled in this art will have no difficulty in making changes and modifications in the individual parts or their relative assembly in order to meet specific requirements or conditions. Such changes and modifications may be made without departing from the scope and spirit of the invention, as set forth in the following claims.

I claim:

1. A method of forming a gold plating on selected portions of the surface of an article which is or can be made susceptible to electrodeposition thereon of both gold and aluminum metal, comprising the steps of:
   a. placing the article to be coated into an electroplating means for electrodeposition of aluminum comprising a suitable electrolyte having disposed therein an anode of aluminum metal;
   b. electroplating the article with aluminum by interconnecting the article and the aluminum electrode with a source of electric current so that the article forms the negative electrode and the anode of aluminum metal forms the positive electrode;

c. removing the aluminum coating from the composite thus formed in those portions selected for gold plating; and d. placing the partially coated composite thus formed into an electroplating means for electrodeposition of gold so as to electroplate the partially coated composite with gold in the selected areas where aluminum coating was removed.

2. A method as defined in claim 1 including the step of electroplating the article with nickel prior to the electrodeposition of aluminum.

3. A method as defined in claim 2 in which the aluminum coating is removed from the composite by mechanical abrasion.

4. A method as defined in claim 2 in which the aluminum is removed from the composition by chemical etching.

5. A method as defined in claim 4 in which the chemical etching is accomplished using a solution of dilute hydrochloric acid.

6. A method as defined in claim 4 in which the chemical etching is accomplished using a solution of sodium hydroxide.

7. A method of selectively electroplating a base material comprising the steps of:

a. forming on the base material an aluminum coating, said aluminum coating being located to expose selected portions of the base material, said base material presenting an aluminum coating surface selected from the group consisting of steel, copper, nickel, tin, zinc and silver; and b. cathodically electrodepositing onto the exposed portions of the base material a second coating comprising a material which will not deposit on said aluminum coating, said second coating material being selected from a group consisting of gold and copper.

8. A method of selectively electroplating a base material comprising the steps of:

a. applying an aluminum coating to the base material, said base material presenting an aluminum coating receiving surface selected from a group consisting of steel, copper, nickel, tin, zinc and silver;

b. selectively removing said aluminum coating from the base material in those areas which are to be electroplated; and c. electrodepositing onto the areas of said base material not covered by said aluminum coating a second coating consisting of a metal which will not deposit on aluminum, said second coating metal being selected from a group consisting of gold and copper.

9. The method as defined in claim 8 in which said aluminum coating is removed from the base material by mechanical means.

10. The method as defined in claim 8 in which said aluminum coating is removed from the base material by chemical means.

11. The method as defined in claim 8 in which said aluminum coating is formed on the base material by cathodic electrodeposition.

12. The method as defined in claim 8 in which said aluminum coating is applied to the base material by vapor deposition.

* * * * *